United States Patent
Ritter et al.

(10) Patent No.: US 10,020,116 B2
(45) Date of Patent: *Jul. 10, 2018

(54) PLATED TERMINATIONS

(71) Applicant: AVX Corporation, Fountain Inn, SC (US)

(72) Inventors: Andrew P. Ritter, Simpsonville, SC (US); Robert H. Heistand, II, St. Johns, FL (US); John L. Galvagni, Hendersonville, NC (US); Sriram Dattaguru, Chandler, AZ (US)

(73) Assignee: AVX Corporation, Myrtle Beach, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/354,465

(22) Filed: Nov. 17, 2016

(65) Prior Publication Data

US 2017/0084396 A1 Mar. 23, 2017

Related U.S. Application Data

(60) Continuation of application No. 10/951,972, filed on Sep. 28, 2004, which is a division of application No.
(Continued)

(51) Int. Cl.
*H01G 4/00* (2006.01)
*H01G 4/30* (2006.01)
(Continued)

(52) U.S. Cl.
CPC .......... *H01G 4/30* (2013.01); *C23C 18/1651* (2013.01); *C23C 18/1653* (2013.01);
(Continued)

(58) Field of Classification Search
USPC ..................................................... 427/79–81
See application file for complete search history.

(56) References Cited

U.S. PATENT DOCUMENTS

| 369,545 A | 9/1887 | Monroe et al. |
| 437,011 A | 9/1890 | Bentley |

(Continued)

FOREIGN PATENT DOCUMENTS

| CN | 1723514 | 1/2006 |
| CN | 101030476 A | 9/2007 |

(Continued)

OTHER PUBLICATIONS

English Abstract of JP(S) 63-146421 listed above.
(Continued)

*Primary Examiner* — Brian K Talbot
(74) *Attorney, Agent, or Firm* — Dority & Manning, P.A.

(57) ABSTRACT

Improved termination features for multilayer electronic components are disclosed. Monolithic components are provided with plated terminations whereby the need for typical thick-film termination stripes is eliminated or greatly simplified. Such termination technology eliminates many typical termination problems and enables a higher number of terminations with finer pitch, which may be especially beneficial on smaller electronic components. The subject plated terminations are guided and anchored by exposed internal electrode tabs and additional anchor tab portions which may optionally extend to the cover layers of a multilayer component. Such anchor tabs may be positioned internally or externally relative to a chip structure to nucleate additional metallized plating material. External anchor tabs positioned on top and bottom sides of a monolithic structure can facilitate the formation of wrap-around plated terminations. The disclosed technology may be utilized with a plurality of monolithic multilayer components, including interdigitated capacitors, multilayer capacitor arrays, and integrated passive components. A variety of different plating techniques and termination materials may be employed in
(Continued)

the formation of the subject self-determining plated terminations.

15 Claims, 9 Drawing Sheets

Related U.S. Application Data

10/409,023, filed on Apr. 8, 2003, now Pat. No. 7,152,291.

(60) Provisional application No. 60/372,673, filed on Apr. 15, 2002.

(51) Int. Cl.

| | | |
|---|---|---|
| H01C 1/14 | (2006.01) | |
| H01C 7/00 | (2006.01) | |
| H01C 7/10 | (2006.01) | |
| H01G 4/005 | (2006.01) | |
| H01G 4/012 | (2006.01) | |
| H01G 4/228 | (2006.01) | |
| H01G 4/232 | (2006.01) | |
| C25D 5/02 | (2006.01) | |
| H05K 3/02 | (2006.01) | |
| C23C 18/16 | (2006.01) | |
| C23C 18/32 | (2006.01) | |
| C23C 18/38 | (2006.01) | |
| C23C 18/48 | (2006.01) | |
| C23C 28/02 | (2006.01) | |
| C25D 7/00 | (2006.01) | |
| H01G 4/008 | (2006.01) | |
| H01G 4/12 | (2006.01) | |
| C25D 3/56 | (2006.01) | |
| C25D 5/34 | (2006.01) | |
| H01C 17/28 | (2006.01) | |
| H01F 41/04 | (2006.01) | |
| H01G 4/06 | (2006.01) | |
| H05K 3/40 | (2006.01) | |

(52) U.S. Cl.
CPC ............. *C23C 18/32* (2013.01); *C23C 18/38* (2013.01); *C23C 18/48* (2013.01); *C23C 28/021* (2013.01); *C23C 28/023* (2013.01); *C25D 3/56* (2013.01); *C25D 5/02* (2013.01); *C25D 5/34* (2013.01); *C25D 7/00* (2013.01); *H01C 1/14* (2013.01); *H01C 7/008* (2013.01); *H01C 7/10* (2013.01); *H01C 17/28* (2013.01); *H01F 41/04* (2013.01); *H01G 4/005* (2013.01); *H01G 4/008* (2013.01); *H01G 4/012* (2013.01); *H01G 4/06* (2013.01); *H01G 4/12* (2013.01); *H01G 4/228* (2013.01); *H01G 4/232* (2013.01); *H05K 3/02* (2013.01); *H05K 3/403* (2013.01); *H05K 2201/09709* (2013.01); *Y10T 29/417* (2015.01); *Y10T 29/42* (2015.01); *Y10T 29/43* (2015.01); *Y10T 29/435* (2015.01); *Y10T 29/49002* (2015.01); *Y10T 29/49099* (2015.01); *Y10T 29/49101* (2015.01)

(56) References Cited

U.S. PATENT DOCUMENTS

| | | |
|---|---|---|
| 3,258,898 A | 7/1966 | Garibotti |
| 3,284,684 A | 11/1966 | Gaenge |
| 3,296,012 A | 1/1967 | Stainecker, Jr. |
| 3,448,355 A | 6/1969 | Ahearn, Jr. et al. |
| 3,452,257 A | 6/1969 | Belko, Jr. |
| 3,612,963 A | 10/1971 | Piper et al. |
| 3,665,267 A | 5/1972 | Acello |
| 3,679,950 A | 7/1972 | Rutt |
| 3,740,624 A | 6/1973 | McAdams, Jr. et al. |
| 3,809,973 A | 5/1974 | Hurley |
| 3,898,541 A | 8/1975 | Weller |
| 3,965,552 A | 6/1976 | Rutt |
| 3,988,498 A | 10/1976 | Maher |
| 3,992,761 A | 11/1976 | McElroy et al. |
| 4,064,606 A | 12/1977 | Dunn |
| 4,113,899 A | 9/1978 | Henry et al. |
| 4,241,378 A | 12/1980 | Dorrian |
| 4,266,265 A | 5/1981 | Maher |
| 4,289,384 A | 9/1981 | Samek |
| 4,425,378 A | 1/1984 | Maher |
| 4,458,294 A | 7/1984 | Womack |
| 4,466,045 A | 8/1984 | Coleman |
| 4,471,406 A | 9/1984 | Sawairi |
| 4,478,690 A | 10/1984 | Scholtens |
| 4,482,934 A | 11/1984 | Hirota et al. |
| 4,486,813 A | 12/1984 | Maher |
| 4,503,131 A | 3/1985 | Baudrand |
| 4,555,414 A | 11/1985 | Hoover et al. |
| 4,574,329 A | 3/1986 | Eijkelenkamp et al. |
| 4,609,409 A | 9/1986 | Senda et al. |
| 4,613,518 A | 9/1986 | Ham et al. |
| 4,658,328 A | 4/1987 | Sakabe |
| 4,661,884 A | 4/1987 | Seaman |
| 4,681,656 A | 7/1987 | Byrum |
| 4,706,162 A | 11/1987 | Hernandez et al. |
| 4,729,058 A | 3/1988 | Gupta et al. |
| 4,803,543 A | 2/1989 | Inayoshi et al. |
| 4,806,159 A | 2/1989 | De Keyser et al. |
| 4,811,162 A | 3/1989 | Maher et al. |
| 4,811,164 A | 3/1989 | Ling et al. |
| 4,819,128 A | 4/1989 | Florian et al. |
| 4,831,494 A | 5/1989 | Arnold et al. |
| 4,852,227 A | 8/1989 | Burks |
| 4,853,320 A | 8/1989 | Jacobs et al. |
| 4,919,076 A | 4/1990 | Lutz et al. |
| 5,021,921 A | 6/1991 | Sano et al. |
| 5,058,799 A | 10/1991 | Zsamboky |
| 5,100,714 A | 3/1992 | Zsamboky |
| 5,159,300 A | 10/1992 | Nakamura et al. |
| 5,196,822 A | 3/1993 | Gallusser et al. |
| 5,226,382 A | 7/1993 | Braden |
| 5,251,094 A | 10/1993 | Amano et al. |
| 5,292,558 A | 3/1994 | Heller et al. |
| 5,311,651 A | 5/1994 | Kim et al. |
| 5,369,545 A | 11/1994 | Bhattacharyya et al. |
| 5,412,357 A | 5/1995 | Nakamura et al. |
| 5,464,653 A | 11/1995 | Chantraine et al. |
| 5,493,266 A | 2/1996 | Sasaki et al. |
| 5,517,754 A | 5/1996 | Beilstein, Jr. et al. |
| 5,547,906 A | 8/1996 | Badehi |
| 5,550,705 A | 8/1996 | Moncrieff |
| 5,576,052 A | 11/1996 | Arledge et al. |
| 5,576,053 A | 11/1996 | Senda et al. |
| 5,621,375 A | 4/1997 | Gurevich |
| 5,635,894 A | 6/1997 | Morant |
| 5,668,694 A | 9/1997 | Sato et al. |
| 5,712,758 A | 1/1998 | Amano et al. |
| 5,716,713 A | 2/1998 | Zsamboky et al. |
| 5,753,299 A | 5/1998 | Garcia et al. |
| 5,758,398 A | 6/1998 | Rjinbeek et al. |
| 5,770,476 A | 6/1998 | Stone |
| 5,805,409 A | 9/1998 | Takahara et al. |
| 5,849,170 A | 12/1998 | Djokic et al. |
| 5,863,331 A | 1/1999 | Braden et al. |
| 5,870,273 A | 2/1999 | Sogabe et al. |
| 5,880,011 A | 3/1999 | Zablotny et al. |
| 5,880,925 A | 3/1999 | DuPre et al. |
| 5,944,897 A | 8/1999 | Braden |
| 5,985,414 A | 11/1999 | Fukuda et al. |
| 5,990,778 A | 11/1999 | Strumpler et al. |
| 6,040,755 A | 3/2000 | Abe et al. |
| 6,141,846 A | 11/2000 | Miki |
| 6,141,870 A | 11/2000 | McDermott et al. |
| 6,151,204 A | 11/2000 | Shigemoto et al. |
| 6,159,768 A | 12/2000 | Ahn |

(56) References Cited

U.S. PATENT DOCUMENTS

| | | | |
|---|---|---|---|
| 6,181,544 B1 | 1/2001 | Nakagawa et al. |
| 6,188,565 B1 | 2/2001 | Naito et al. |
| 6,191,932 B1 | 2/2001 | Kuroda et al. |
| 6,191,933 B1 | 2/2001 | Ishigaki et al. |
| 6,195,249 B1 | 2/2001 | Honda et al. |
| 6,201,683 B1 | 3/2001 | Yamada et al. |
| 6,214,685 B1 | 4/2001 | Clinton et al. |
| 6,232,144 B1 | 5/2001 | McLoughlin |
| 6,243,253 B1 | 6/2001 | DuPre et al. |
| 6,266,229 B1 | 7/2001 | Naito et al. |
| 6,288,887 B1 | 9/2001 | Yoshida et al. |
| 6,292,351 B1 | 9/2001 | Ahiko et al. |
| 6,310,757 B1 | 10/2001 | Tuzuki et al. |
| 6,311,390 B1 | 11/2001 | Abe et al. |
| 6,343,004 B1 | 1/2002 | Kuranuki et al. |
| 6,362,723 B1 | 3/2002 | Kawase |
| 6,370,010 B1 | 4/2002 | Kuroda et al. |
| 6,375,457 B1 | 4/2002 | Ohshio |
| 6,380,619 B2 | 4/2002 | Ahiko et al. |
| 6,381,117 B1 | 4/2002 | Nakagawa et al. |
| 6,388,864 B1 | 5/2002 | Nakagawa et al. |
| 6,388,865 B1 | 5/2002 | Honda et al. |
| 6,392,869 B2 | 5/2002 | Shiraishi et al. |
| 6,407,906 B1 | 6/2002 | Ahiko et al. |
| 6,413,862 B1 | 7/2002 | Farnworth et al. |
| 6,428,942 B1 | 8/2002 | Jiang et al. |
| 6,429,533 B1 | 8/2002 | Li et al. |
| 6,433,992 B2 | 8/2002 | Nakagawa et al. |
| 6,452,781 B1 | 9/2002 | Ahiko et al. |
| 6,493,207 B2 | 12/2002 | Nakano et al. |
| 6,496,355 B1 | 12/2002 | Galvagni et al. |
| 6,515,842 B1 | 2/2003 | Hayworth et al. |
| 6,525,395 B1 | 2/2003 | Kawase |
| 6,531,806 B1 | 3/2003 | Daidai |
| 6,563,689 B2 | 5/2003 | Yamamoto |
| 6,577,486 B1 * | 6/2003 | Nishimiya ............... H01G 2/14 361/103 |
| 6,594,136 B2 | 7/2003 | Kuroda et al. |
| 6,621,011 B1 | 9/2003 | Daidai et al. |
| 6,621,682 B1 | 9/2003 | Takakuwa et al. |
| 6,628,502 B2 | 9/2003 | Masumiya et al. |
| 6,661,638 B2 | 12/2003 | Jackson et al. |
| 6,661,639 B1 | 12/2003 | Devoe et al. |
| 6,661,640 B2 | 12/2003 | Togashi |
| 6,696,647 B2 | 2/2004 | Ono et al. |
| 6,729,003 B2 | 5/2004 | Yokoyama et al. |
| 6,743,479 B2 | 6/2004 | Kanoh et al. |
| 6,765,781 B2 | 7/2004 | Togashi |
| 6,816,356 B2 | 11/2004 | Devoe et al. |
| 6,819,543 B2 | 11/2004 | Vieweg et al. |
| 6,822,847 B2 | 11/2004 | Devoe et al. |
| 6,829,134 B2 | 12/2004 | Yamauchi et al. |
| 6,838,153 B2 | 1/2005 | Honda et al. |
| 6,905,768 B2 | 6/2005 | Tada et al. |
| 6,911,893 B2 | 6/2005 | Kodama et al. |
| 6,922,329 B2 | 7/2005 | Togashi |
| 6,956,731 B2 | 10/2005 | Yoshii et al. |
| 6,960,366 B2 | 11/2005 | Ritter et al. |
| 6,970,341 B1 | 11/2005 | Devoe et al. |
| 6,972,942 B2 | 12/2005 | Ritter et al. |
| 6,982,863 B2 | 1/2006 | Galvagni et al. |
| 7,005,192 B2 | 2/2006 | Sanada et al. |
| 7,067,172 B2 | 6/2006 | Ritter et al. |
| 7,075,776 B1 | 7/2006 | Devoe et al. |
| 7,152,291 B2 | 12/2006 | Ritter et al. |
| 7,154,374 B2 | 12/2006 | Ritter et al. |
| 7,161,794 B2 | 1/2007 | Galvagni et al. |
| 7,177,137 B2 | 2/2007 | Ritter et al. |
| 7,258,819 B2 | 8/2007 | Harris, IV |
| 7,307,829 B1 | 12/2007 | Devoe et al. |
| 7,312,145 B2 | 12/2007 | Hashimoto |
| 7,329,976 B2 | 2/2008 | Shirasu et al. |
| 7,344,981 B2 | 3/2008 | Ritter et al. |
| 7,345,868 B2 | 3/2008 | Trinh |
| 7,463,474 B2 | 12/2008 | Ritter et al. |
| 7,505,249 B2 | 3/2009 | Komatsu et al. |
| 7,567,427 B2 | 7/2009 | Nagamiya |
| 7,589,952 B2 | 9/2009 | Motoki et al. |
| 7,589,953 B2 | 9/2009 | Togashi et al. |
| 7,605,683 B2 | 10/2009 | Sawada et al. |
| 7,633,739 B2 | 12/2009 | Devoe |
| 7,719,819 B2 | 5/2010 | Motoki et al. |
| 7,751,174 B2 | 7/2010 | Kimura et al. |
| 7,847,371 B2 | 12/2010 | Komatsu et al. |
| 7,933,113 B2 | 4/2011 | Motoki et al. |
| 8,004,819 B2 | 8/2011 | Nagamiya et al. |
| 8,149,565 B2 | 4/2012 | Lee et al. |
| 8,163,331 B2 | 4/2012 | Trinh |
| 8,184,424 B2 | 5/2012 | Motoki et al. |
| 8,974,654 B1 | 3/2015 | Trinh |
| 9,412,519 B1 | 8/2016 | Trinh |
| 2002/0001712 A1 | 1/2002 | Higuchi |
| 2003/0011962 A1 | 1/2003 | Yamamoto |
| 2003/0011963 A1 | 1/2003 | Ahiko et al. |
| 2003/0026059 A1 | 2/2003 | Togashi |
| 2003/0071245 A1 | 4/2003 | Harris |
| 2003/0231457 A1 | 12/2003 | Ritter et al. |
| 2004/0090733 A1 | 5/2004 | Devoe et al. |
| 2004/0174656 A1 | 9/2004 | MacNeal et al. |
| 2005/0046536 A1 | 3/2005 | Ritter et al. |
| 2005/0057887 A1 | 3/2005 | Devoe et al. |
| 2007/0014075 A1 | 1/2007 | Ritter et al. |
| 2008/0081200 A1 | 4/2008 | Katsube et al. |
| 2008/0123248 A1 | 5/2008 | Kunishi et al. |
| 2008/0123249 A1 | 5/2008 | Kunishi et al. |
| 2008/0145551 A1 | 6/2008 | Kunishi et al. |
| 2008/0158774 A1 | 7/2008 | Trinh |
| 2008/0291602 A1 | 11/2008 | Devoe |
| 2009/0052114 A1 | 2/2009 | Motoki et al. |
| 2009/0268374 A1 | 10/2009 | Motoki et al. |
| 2011/0205684 A1 | 8/2011 | Yamamoto et al. |

FOREIGN PATENT DOCUMENTS

| | | | |
|---|---|---|---|
| DE | 103 16 983 A1 | | 12/2003 |
| EP | 0 183 399 A2 | | 6/1986 |
| EP | 0 289 239 A2 | | 11/1988 |
| EP | 0351343 | | 1/1990 |
| EP | 0 379 066 A2 | | 7/1990 |
| EP | 0 955 795 A2 | | 11/1999 |
| EP | 1 335 392 A1 | | 8/2003 |
| EP | 1 482 524 A1 | | 12/2004 |
| EP | 1 571 680 A1 | | 9/2005 |
| EP | 1 826 787 A1 | | 8/2007 |
| GB | 1535662 A | | 12/1978 |
| GB | 1540403 | | 2/1979 |
| GB | 2326976 A | | 1/1999 |
| GB | 2334377 A | | 8/1999 |
| GB | 2389708 A | | 12/2003 |
| JP | 61-183913 | * | 8/1986 |
| JP | 62-145602 | | 6/1987 |
| JP | 63-146421 | | 6/1988 |
| JP | 63-169014 | | 7/1988 |
| JP | 64-54720 | | 3/1989 |
| JP | S6454720 | | 3/1989 |
| JP | 1201902 | | 8/1989 |
| JP | 01-293503 | | 11/1989 |
| JP | H01293504 | | 11/1989 |
| JP | H 01-313804 | | 12/1989 |
| JP | H 02-294007 | | 12/1990 |
| JP | 3-178110 | | 8/1991 |
| JP | 03-192706 | | 8/1991 |
| JP | H 04-268710 | | 9/1992 |
| JP | 05-144665 | | 6/1993 |
| JP | H 06-69063 | | 3/1994 |
| JP | H 6168845 | | 6/1994 |
| JP | 06-267784 | | 9/1994 |
| JP | 07-335473 | * | 12/1995 |
| JP | 08-037127 | | 2/1996 |
| JP | 08-203771 | | 8/1996 |
| JP | H 08-264372 | | 10/1996 |
| JP | H 09-129476 | | 5/1997 |
| JP | H 09-129477 | | 5/1997 |
| JP | H 09-190946 | | 7/1997 |

(56) References Cited

FOREIGN PATENT DOCUMENTS

| | | | |
|---|---|---|---|
| JP | 10-154632 | | 6/1998 |
| JP | 10-256076 | | 9/1998 |
| JP | H 10-251837 | | 9/1998 |
| JP | 11-162771 | | 6/1999 |
| JP | H 11-154621 | | 6/1999 |
| JP | 11-219849 | | 8/1999 |
| JP | 2000-107658 | | 4/2000 |
| JP | 2000-243662 | | 9/2000 |
| JP | 2000-277380 | | 10/2000 |
| JP | 2000-340448 | * | 12/2000 |
| JP | 2001-023862 | A | 1/2001 |
| JP | 2001-203122 | | 7/2001 |
| JP | 2002-033237 | | 1/2002 |
| JP | 2002-161123 | | 6/2002 |
| JP | 2002-164257 | A | 6/2002 |
| JP | 2003-272945 | | 9/2003 |
| JP | 2004-47707 | | 2/2004 |
| JP | 2004-228514 | | 8/2004 |
| JP | 2005-086676 | | 3/2005 |
| JP | 2005-264095 | | 9/2005 |
| JP | 2005-340371 | | 12/2005 |
| JP | 2006-053577 | | 2/2006 |
| JP | 2006-210590 | | 8/2006 |
| JP | 2006-332601 | | 12/2006 |
| JP | 2006-339536 | | 12/2006 |
| JP | 2009-267146 | | 11/2009 |
| JP | 2009-295602 | | 12/2009 |
| KR | 2001-0062384 | | 7/2001 |
| WO | WO 0203405 A1 | | 1/2002 |
| WO | WO 03/075295 | | 9/2003 |
| WO | WO 2007/049456 | | 5/2007 |
| WO | WO 2008/023496 | | 2/2008 |

OTHER PUBLICATIONS

English Translation of JP 63-169014 listed above.
English Abstract of JP(S) 64-54720 listed above.
English Abstract of JP(H) 1201902 listed above.
English Abstract of JP 01-293503 listed above.
English Abstract of JP(H) 01-313804 listed above.
English Abstract of JP(H) 02-294007 listed above.
English Abstract of JP(H) 03-178110 listed above.
English Abstract of JP(H) 04-268710 listed above.
English Abstract of JP(H) 06-69063 listed above.
English Abstract of JP(H) 6168845 listed above.
English Abstract of JP(H) 08-264372 listed above.
R.P. Prassad, Product Details-Table of Contents of Surface Mount Technology Principles and Practice (Second Edition), published Mar. 6, 1997 by Springer-Verlag New York, LLC.
English Abstract of JP(H) 09-129476 listed above.
English Abstract of JP(H) 09-129477 listed above.
English Abstract of JP(H) 09-190946 listed above.
English Abstract of JP 10-154632 listed above.
English Abstract of JP(H) 10-251837 listed above.
English Abstract of JP(H) 11-154621 listed above.
English Abstract of JP 2000-107658 listed above.
Machine/English translation of JP 2000-243662 listed above.
English Abstract of JP 2000-277380 listed above.
English Abstract of JP 2001-023862A listed above.
Raymund Singleton, Plating Procedures-Barrel Plating, Metal Finishing Guidebook and Directory, 2001, p. 340-359.
English Abstract of JP 2001-203122 listed above.
Marc J. Madou, Fundamentals of Microfabrication: The Science of Miniaturization—Table of Contents, published 2002 by CRC Press.
Hung Van Trinh, "An Electrodeposition Method for Terminals of Multilayer Ceramic Capacitors," (a thesis submitted in partial satisfaction of the requirements for the degree Master of Science in Materials Science and Engineering, University of California-San Diego), Mar. 23, 2002.
English Abstract of JP 2002-164257A listed above.

Hung Van Trinh and Jan B. Talbot, "An Electrodeposition Method for Terminals of Multilayer Ceramic Capacitors" CARTS 2003: 23rd Capacitor and Resistor Technology Symposium, Mar. 31-Apr. 3, 2003.
Hung Van Trinh and Jan B. Talbot, "Electrodeposition Method for Terminals of Multilayer Ceramic Capacitors," Journal of the American Ceramic Society, vol. 86, No. 6, Jun. 2003.
English Abstract of JP 2003-272945 listed above.
English Abstract of JP 2004-47707 listed above.
EP Search Report for GB Application No. 0308656.8 dated May 6, 2004.
EP Search Report for GB Application No. 0405993.7 dated Jul. 26, 2004.
English Abstract of JP 2004-228514 listed above.
EP Search Report for GB Application No. 0425963.6 dated Jan. 26, 2005.
EP Search Report for GB Application No. 0425961.0 dated Jan. 27, 2005.
English Abstract of Jp 2005-086676 listed above.
EP Search Report for GB Application No. 0308656.8 dated Sep. 8, 2005.
English Abstract of JP 2005-340371 listed above.
English Abstract of JP 2006-210590 listed above.
English Abstract of JP 2006-332601 listed above.
English Abstract of JP 2006-339536 listed above.
Bibliographic Data of WO 2007/049456 listed above.
Bibliographic Data of WO 2008/023496 listed above.
English Abstract of JP 2009-267146 listed above.
English Abstract of JP 2009-295602 listed above.
English Abstract and details of CN 101030476A listed above.
Hung Van Trinh, Declaration Under 37 CFR § 1.131 related to U.S. Appl. No. 10/267,983 dated Sep. 27, 2007 (now U.S. Pat. No. 7,345,868 dated Mar. 18, 2008).
May 8, 2009 Office Action issued in Chinese Patent Application No. 2007100847817 (in Chinese).
Jun. 2, 2009 Office Action issued in Japanese Patent Application No. 2006-053577 (in Japanese).
Feb. 23, 2010 Official Communication issued in Japanese Patent Application No. 2007-270915, with English translation.
Aug. 11, 2010 Office Action issued in European Patent Application No. 07 004 051.4 2.
Feb. 8, 2012 Official Communication issued in Korean Patent Application No. 10-2011-0011354, with English translation.
Sep. 6, 2013 Office Action issued in related U.S. Appl. No. 10/951,972.
Dec. 6, 2013 Office Action issued in German Patent Application No. 103 16 983.0 (in German).
Extended European Search Report; EU Pat. No. 15175266.4; report issued Nov. 24, 2015; 6 pages.
Abstract and Machine Translation of Chinese Patent—CN1045890, Oct. 3, 1990, 7 pages.
Translation of Japanese Patent—JP55563817, May 14, 1980, 5 pages.
Translation of Japanese Patent—JPS63169014, Jul. 13, 1988, 3 pages.
Abstract of Japanese Patent—JPS6454720, Mar. 2, 1989, 1 page.
Abstract and Translation of Japanese Patent—JPH0329307, Feb. 7 1991, 7 pages.
Abstract of Japanese Patent—JPH04111304, Apr. 13, 1992, 2 pages.
Abstract of Japanese Patent—JPH04188812, Jul. 7, 1992, 2 pages.
Abstract and Machine Translation of Japanese Patent—JPH06196351, Jul. 15, 1994, 5 pages.
Abstract and Machine Translation of Japanese Patent—JPH0864463, Mar. 8, 1996, 6 pages.
Abstract and Machine Translation of Japanese Patent—JPH09180957, Jul. 11, 1997, 6 pages.
Abstract, Machine Translation, and Translation of Japanese Patent—JP2000306763, Nov. 2, 2000, 14 pages.
European Search Report for EP 15175266.4 dated Nov. 24, 2015, 6 pages.

* cited by examiner

PLATED TERMINATIONS

PRIORITY CLAIM

This application is a continuation of pending U.S. patent application Ser. No. 10/951,972 filed Sep. 28, 2004, which is a divisional of U.S. patent application Ser. No. 10/409,023 filed Apr. 8, 2003, and issued Dec. 26, 2006 as U.S. Pat. No. 7,152,291, which claims benefit of previously filed U.S. Provisional Patent Application Ser. No. 60/372,673 filed Apr. 15, 2002, all entitled "PLATED TERMINATIONS" and having the same inventors as present, all of which are hereby incorporated herein by reference in their entireties for all purposes. Any disclaimer that may have occurred during prosecution of the above-referenced application(s) is hereby expressly rescinded.

BACKGROUND OF THE INVENTION

The present subject matter generally concerns improved termination features for multilayer electronic components, and more particularly relates to plated terminations for multilayer capacitors or integrated passive components. The subject termination design utilizes selective arrangements of internal and/or external electrode tabs to facilitate the formation of plated electrical connections. The external connections are preferably made whereby the provision of typical thick film termination stripes is eliminated or greatly simplified.

Many modern electronic components are packaged as monolithic devices, and may comprise a single component or multiple components within a single chip package. One specific example of such a monolithic device is a multilayer capacitor or capacitor array, and of particular interest with respect to the disclosed technology are multilayer capacitors with interdigitated internal electrode layers and corresponding electrode tabs. Examples of multilayer capacitors that include features of interdigitated capacitor (IDC) technology can be found in U.S. Pat. No. 5,880,925 (DuPré et al.) and U.S. Pat. No. 6,243,253 B1 (DuPré et al.). Other monolithic electronic components correspond to devices that integrate multiple passive components into a single chip structure. Such an integrated passive component may provide a selected combination of resistors, capacitors, inductors and/or other passive components that are formed in a multilayered configuration and packaged as a monolithic electronic device.

Selective terminations are often required to form electrical connections for various monolithic electronic components. Multiple terminations are needed to provide electrical connections to the different electronic components of an integrated monolithic device. Multiple terminations are also often used in conjunction with IDC's and other multilayer arrays in order to reduce undesirable inductance levels. One exemplary way that multiple terminations have been formed in multilayer components is by drilling vias through selected areas of a chip structure and filling the vias with conductive material such that an electrical connection is formed among selected electrode portions of the device.

Another way of forming external terminations for the subject devices is to apply a thick film stripe of silver or copper in a glass matrix to exposed portions of internal electrode layers, and subsequently plating additional layers of metal over the termination stripes such that a part is solderable to a substrate. An example of an electronic component with external electrodes formed by baked terminations and metal films plated thereon is disclosed in U.S. Pat. No. 5,021,921 (Sano et al.). The application of terminations is often hard to control and can become problematic with reduction in chip sizes. U.S. Pat. No. 6,232,144 B1 (McLoughlin) and U.S. Pat. No. 6,214,685 B1 (Clinton et al.) concern methods for forming terminations on selected regions of an electronic device.

The ever-shrinking size of electronic components makes it quite difficult to print termination stripes in a predetermined area with required precision. Thick film termination stripes are typically applied with a machine that grabs a chip and applies selective terminations with specially designed wheels. U.S. Pat. No. 5,944,897 (Braden), U.S. Pat. No. 5,863,331 (Braden et al.), U.S. Pat. No. 5,753,299 (Garcia et al.), and U.S. Pat. No. 5,226,382 (Braden) disclose mechanical features and steps related to the application of termination stripes to a chip structure. Reduced component size or an increased number of termination contacts for an electronic chip device may cause the resolution limits of typical termination machines to become maxed out.

Other problems that can arise when trying to apply selective terminations include shifting of the termination lands, mispositioning of terminations such that internal electrode tabs are exposed or missed entirely, and missing wrap-around termination portions. Yet further problems may be caused when too thin a coating of the paint-like termination material is applied or when one portion of termination coating smears into another causing shorted termination lands. These and other concerns surrounding the provision of electrical termination for monolithic devices create a need to provide cheap and effective termination features for electronic chip components.

Yet another known option related to termination application involves aligning a plurality of individual substrate components to a shadow mask. Parts can be loaded into a particularly designed fixture, such as that disclosed in U.S. Pat. No. 4,919,076 (Lutz et al.), and then sputtered through a mask element. This is typically a very expensive manufacturing process, and thus other effective yet more cost efficient termination provisions may be desirable.

U.S. Pat. No. 5,880,011 (Zablotny et al.), U.S. Pat. No. 5,770,476 (Stone), U.S. Pat. No. 6,141,846 (Miki), and U.S. Pat. No. 3,258,898 (Garibotti), respectively deal with aspects of the formation of terminations for various electronic components.

Additional background references that address methodology for forming multilayer ceramic devices include U.S. Pat. No. 4,811,164 (Ling et al.), U.S. Pat. No. 4,266,265 (Maher), U.S. Pat. No. 4,241,378 (Dorrian), and U.S. Pat. No. 3,988,498 (Maher).

While various aspects and alternative features are known in the field of electronic components and terminations therefor, no one design has emerged that generally addresses all of the issues as discussed herein. The disclosures of all the foregoing United States patents are hereby fully incorporated into this application by reference thereto.

BRIEF SUMMARY OF THE INVENTION

The present subject matter recognizes and addresses various of the foregoing shortcomings, and others concerning certain aspects of electrical terminations and related technology. Thus, broadly speaking, a principal object of the presently disclosed technology is improved termination features for electronic components. More particularly, the disclosed termination features are plated and designed to eliminate or greatly simplify thick-film stripes that are typically printed along portions of a monolithic device for termination purposes.

Another principal object of the presently disclosed technology is to offer a way to guide the formation of plated terminations through the provision of internal electrode tabs and the optional placement of additional anchor tabs. Both internal electrode tabs and additional anchor tabs can facilitate the formation of secure and reliable external plating. Anchor tabs, which typically provide no internal electrical connections, may be provided for enhanced external termination connectivity, better mechanical integrity and deposition of plating materials.

Yet another principal object of the present subject matter is to provide termination features for electronic components whereby typical thick-film termination stripes are eliminated or simplified, and only plated terminations are needed to effect an external electrode connection. Plated materials in accordance with the disclosed technology may comprise metallic conductors, resistive materials, and/or semi-conductive materials.

A still further principal object of the subject termination technology is that termination features can be used in accordance with a variety of multilayer monolithic devices, including, for example, interdigitated capacitors, multilayer capacitor arrays, and integrated passive components. Integrated passive components may include a select combination of resistors, capacitors, varistors, inductors, baluns, couplers, and/or other passive components.

A resultant advantage of the disclosed subject matter is that termination features for electronic components can be effected without the need for application by termination machinery, thus providing an ability to yield external terminations with resolution levels that may otherwise be unattainable. Such improved termination resolution also enables the provision of more terminations within a given component area and terminations with a much finer pitch.

A general object of the present technology is to provide termination features that enable an effective solder base with reduced susceptibility to solder leaching and also lowered insulation resistance. Configuration of exposed electrode portions and anchor tab portions is designed such that selected adjacent exposed tab portions are decorated with plated termination material without undesired bridging among distinct termination locations.

Yet another object of the present subject matter is that the disclosed technology can be utilized in accordance with a myriad of different termination configurations, including varied numbers and placement of external terminations. Plated terminations can be formed in accordance with a variety of different plating techniques as disclosed herein at locations that are self-determined by the provision of exposed conductive elements on the periphery of an electronic component.

A still further object of the subject plated termination technology is to facilitate the production of cheaper and more effective electronic components in an expedient and reliable manner.

Additional objects and advantages of the invention are set forth in, or will be apparent to those of ordinary skill in the art from, the detailed description herein. Also, it should be further appreciated by those of ordinary skill in the art that modifications and variations to the specifically illustrated, referenced, and discussed features hereof may be practiced in various embodiments and uses of the disclosed technology without departing from the spirit and scope thereof, by virtue of present reference thereto. Such variations may include, but are not limited to, substitution of equivalent means and features, or materials for those shown, referenced, or discussed, and the functional, operational, or positional reversal of various parts, features, or the like.

Still further, it is to be understood that different embodiments, as well as different presently preferred embodiments, of this invention may include various combinations or configurations of presently disclosed features or elements, or their equivalents (including combinations of features or configurations thereof not expressly shown in the figures or stated in the detailed description). A first exemplary embodiment of the present subject matter relates to a multilayer electronic component with plated terminations. Such a multilayer electronic component may preferably include a plurality of insulating substrate layers with a plurality of electrodes interleaved among the substrate layers. Each respective electrode preferably has at least one tab portion extending therefrom that is exposed along selected edges of the plurality of insulating substrates. Selected of the exposed electrode tab portions are preferably stacked within a predetermined distance of one another such that a plurality of plated terminations may be formed along the periphery of the electronic component.

Another related embodiment of the disclosed technology concerns an electronic component such as the aforementioned first exemplary embodiment, further including additional anchor tabs. In such an exemplary embodiment, anchor tabs may also be interspersed among the plurality of substrate layers and exposed at predetermined locations such that the formation of plated terminations is guided by the location of the exposed electrode tab portions and the exposed anchor tabs. With the provision of a sufficient stack of exposed tabs as well as an exposed tab on each top and bottom surface of the body of dielectric material aligned with the stack of exposed tabs, the formation of a plated termination that extends along an entire exposed side and that wraps around both top and bottom sides of the electronic component is possible and usually, but not always, desirable.

Another exemplary embodiment of the present invention corresponds to an integrated monolithic device comprising at least two passive components. Each passive component is preferably characterized by a ceramic portion and at least one respective internal electrode layer with tab portions extending therefrom that are exposed on selected sides of the integrated monolithic device. Each respective passive component of the monolithic device also preferably includes a corresponding plurality of metallized plating portions formed to connect selected of the respective sets of tab portions and to provide electrical connection to the electrode layers of each respective passive component.

Anchor tabs may also be utilized in accordance with the above exemplary integrated monolithic device to offer additional termination options. By placing internal electrode tabs at selected locations within the device, a variety of different termination options becomes available. The formation of the plated terminations is guided by the location of exposed electrode tabs and anchor tabs, and may potentially wrap around to the top and bottom sides of the monolithic device.

Yet another exemplary embodiment of the present subject matter relates to an interdigitated capacitor comprising a plurality of interleaved electrode and dielectric layers and characterized by respective topmost and bottommost layers. The topmost and bottommost layers of the multilayer interdigitated capacitor preferably comprise dielectric cover layers with a thickness greater than that of the other dielectric layers in the stacked configuration. Each respective electrode layer includes a plurality of electrode tabs that extends to selected sides of the interdigitated capacitor. The electrode tabs are preferably exposed in stacked portions at selected locations along the sides of a capacitor. Anchor tabs are preferably embedded within the top and bottom cover layers and optionally within the active layers such that an exposed stack of tabs extends along a portion of an entire side of the multilayer device. External terminations may then be plated along the stack of exposed tabs and may even wrap around to the topmost and bottommost layers if anchor tabs are positioned thereon and generally aligned with the stack of exposed internal tabs.

Additional embodiments of the present subject matter, not necessarily expressed in this summarized section, may include and incorporate various combinations of aspects of features or parts referenced in the summarized objectives above, and/or features or parts as otherwise discussed in this application.

Those of ordinary skill in the art will better appreciate the features and aspects of such embodiments, and others, upon review of the remainder of the specification.

BRIEF DESCRIPTION OF THE SEVERAL VIEWS OF THE DRAWING

A full and enabling description of the present subject matter, including the best mode thereof, directed to one of ordinary skill in the art, is set forth in the specification, which makes reference to the appended figures, in which.

Figure 1A:
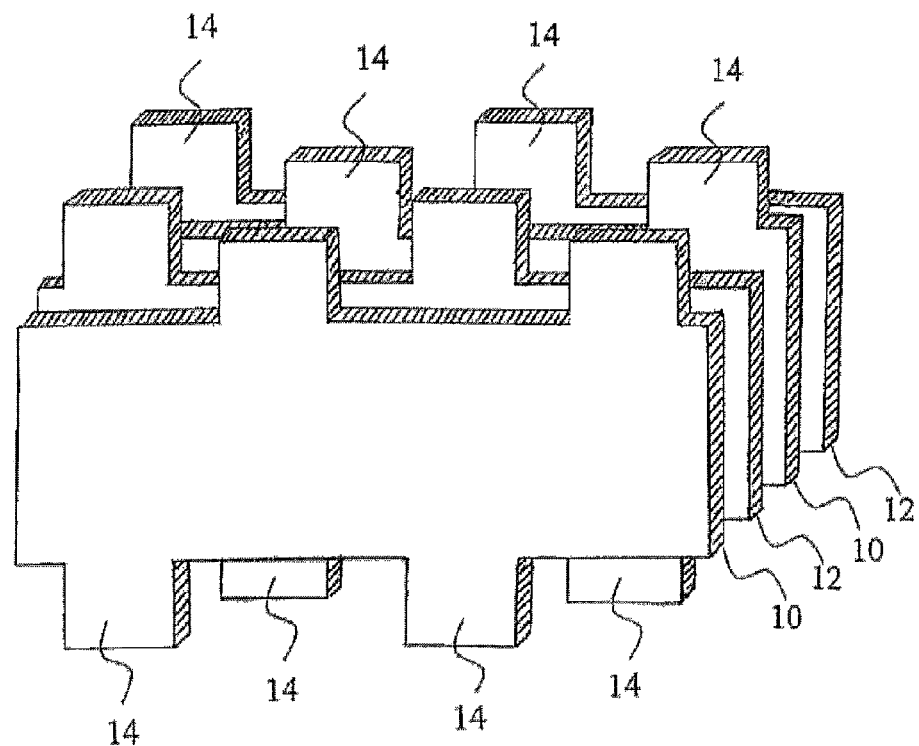
FIG. 1A illustrates a generally top exploded view of a known exemplary electrode layer configuration for a multilayer interdigitated capacitor.

Repeat use of reference characters throughout the present specification and appended drawings is intended to represent same or analogous features or elements of the invention.

DETAILED DESCRIPTION OF THE EMBODIMENTS

As referenced in the Brief Summary of the Invention section, the present subject matter is directed towards improved termination features for monolithic electronic components.

The subject termination scheme utilizes exposed electrode portions of structures such as monolithic capacitor arrays, multilayer capacitors including those with interdigitated electrode configurations, integrated passive components, and other electronic chip structures. Additional anchor tabs may be embedded within such monolithic components to provide stacked pluralities of exposed internal conductive portions to which plated terminations may be formed and securely positioned along the periphery of a device.

By providing additional anchor tabs on the top and bottom surfaces of a chip device, wrap-around plated terminations may be formed that extend along the side of a chip to the top and bottom layers. Such wrap-around terminations may be desirable in certain applications to facilitate soldering of the chip to a printed circuit board or other suitable substrate.

Figure 1B:
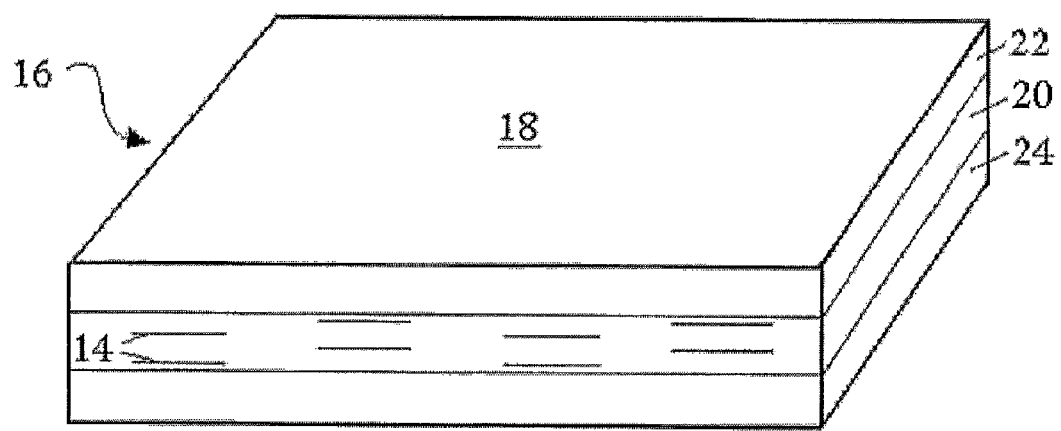
FIG. 1B illustrates a generally side perspective view of an exemplary multilayer interdigitated capacitor with an internal electrode layer configuration such as the known exemplary embodiment illustrated in FIG. 1A.

The subject plating technology and anchor tab features may be utilized in accordance with a plurality of different monolithic components. FIGS. 1A and 1B represent aspects of known interdigitated electrode layer configurations wherein electrode tabs generally extend to and are exposed on two selected sides of a multilayer component. Aspects of plated terminations in accordance with the present subject matter are thereafter presented with respect to FIGS. 2A and 2B, which also concern multilayer component embodiments with exposed conductive portions of two selected sides of a device.

Figure 3A:
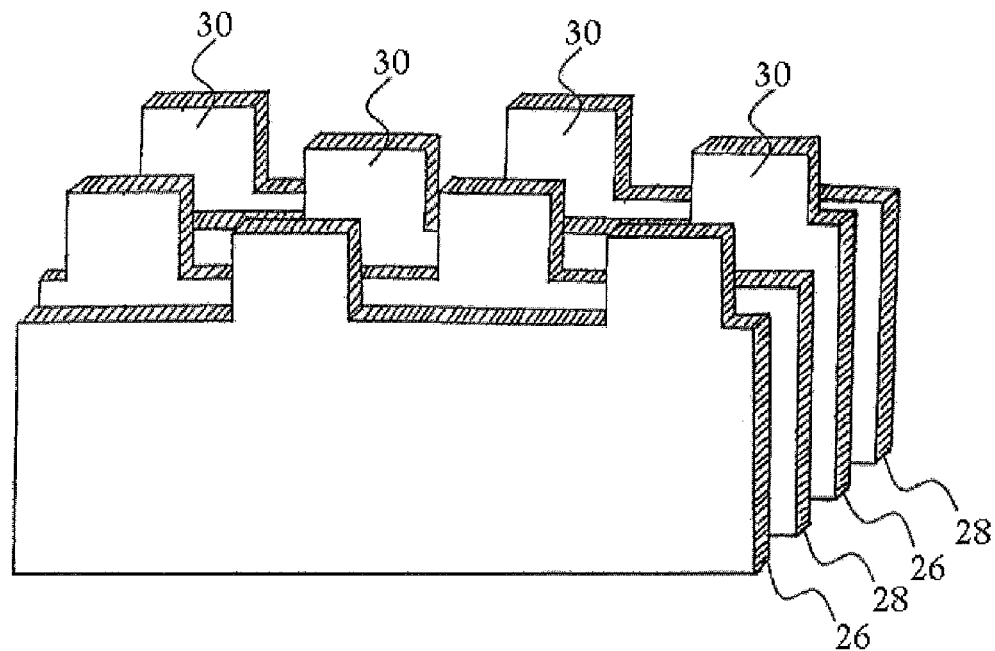
FIG. 3A illustrates a generally top exploded view of a known exemplary internal electrode layer configuration for a multilayer capacitor.
Figure 3B:
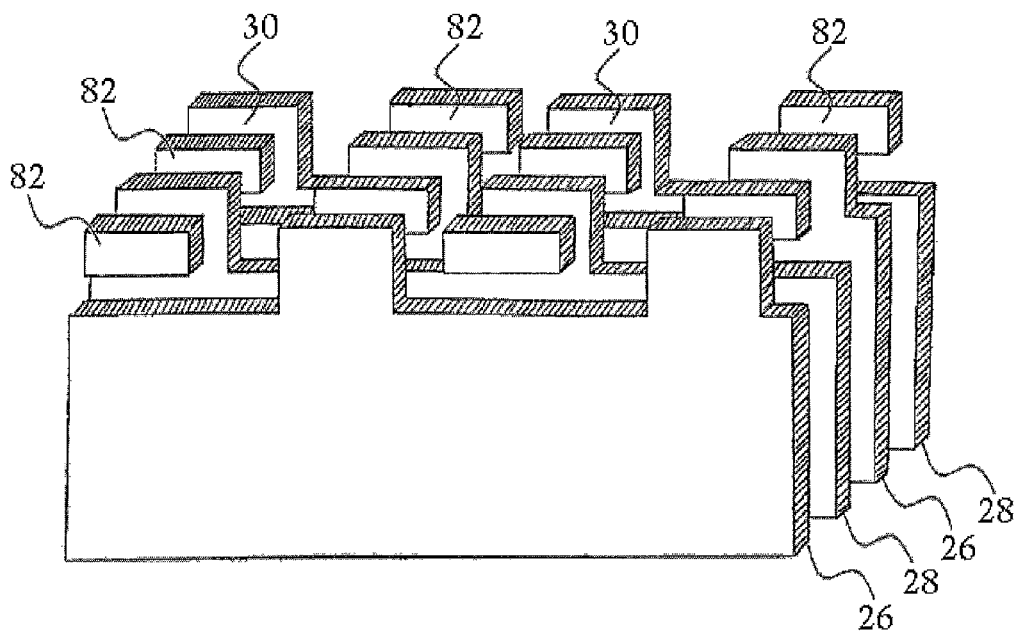
FIG. 3B illustrates a generally top exploded view of an exemplary internal electrode layer and anchor tab configuration for a multilayer capacitor in accordance with the present subject matter.
Figure 4A:
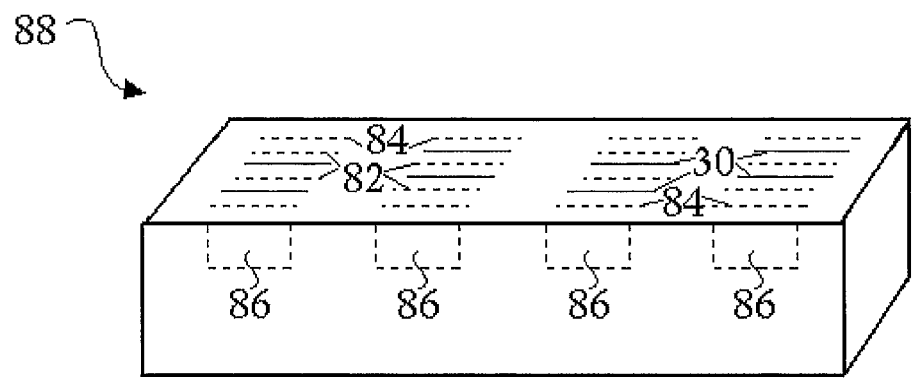
FIG. 4A illustrates a generally side perspective view of an exemplary multilayer capacitor in accordance with the present subject matter with internal electrode and anchor tab portions such as illustrated in FIG. 3B.
Figure 4B:
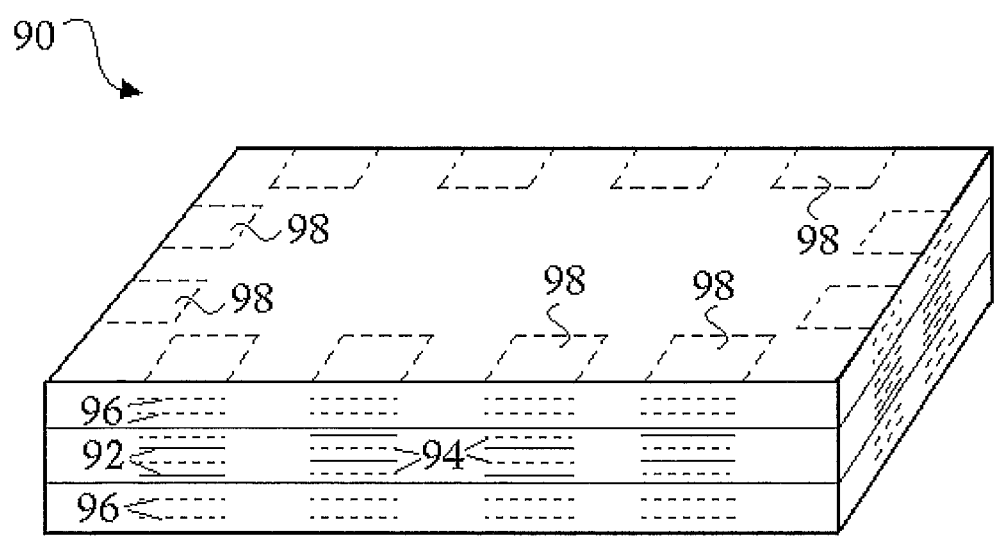
FIG. 4B illustrates a generally side perspective view of an exemplary multilayer interdigitated capacitor in accordance with the present subject matter, featuring internal electrode and anchor tab portions exposed on four selected sides of the exemplary capacitor configuration.

FIG. 3A illustrates aspects of a known electrode layer configuration with electrode tabs for exposure on one selected side of a multilayer electronic device. FIGS. 3B and 4A, respectively, relate to improvements of the exemplary embodiment presented in FIG. 3A, providing for an exemplary multilayer capacitor with internal electrode tabs exposed on one selected side of the capacitor and featuring anchor tabs in accordance with the present technology. FIG. 4B relates to an exemplary multilayer interdigitated component with internal electrode tabs and anchor tabs exposed of four selected sides of the component in accordance with the present subject matter.

Figure 5A:
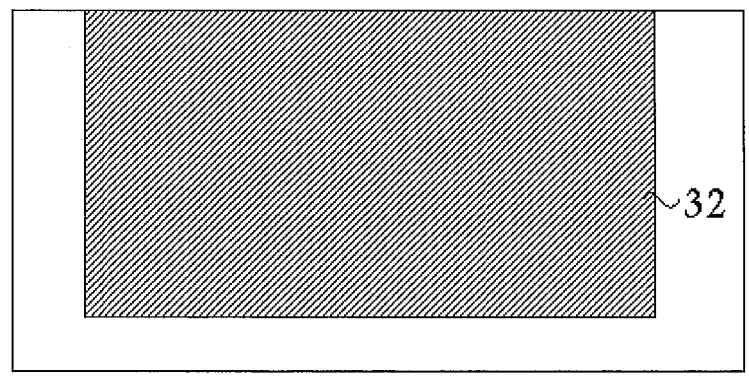
FIGS. 5A and 5B respectively illustrate generally top views of a known electrode layer configuration for use in exemplary multilayer capacitor embodiments.
Figure 5B:
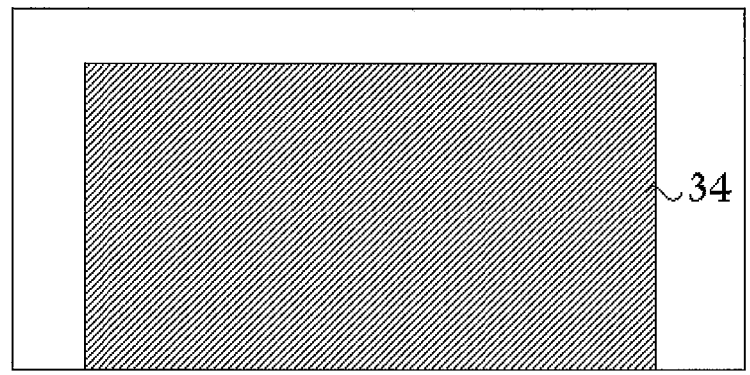
Figure 5C:
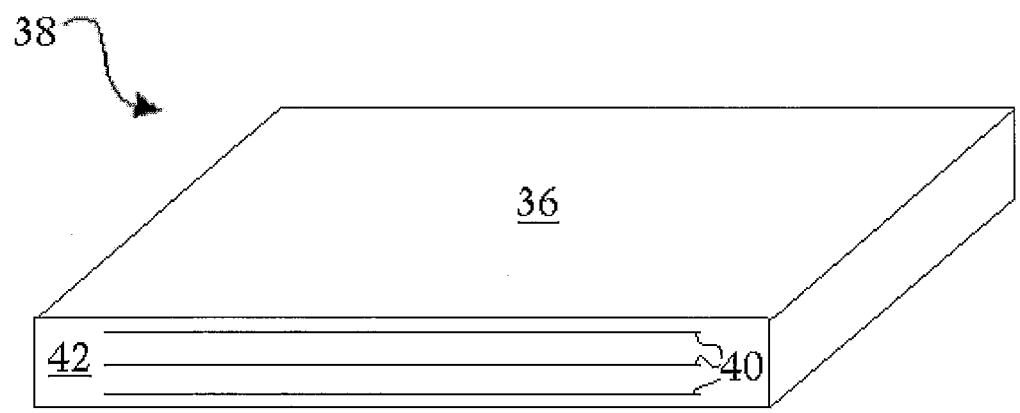
FIG. 5C illustrates a generally side perspective view of an exemplary multilayer capacitor embodiment with electrode layer configurations such as the known exemplary representations of FIGS. 5A and 5B.
Figure 6A:
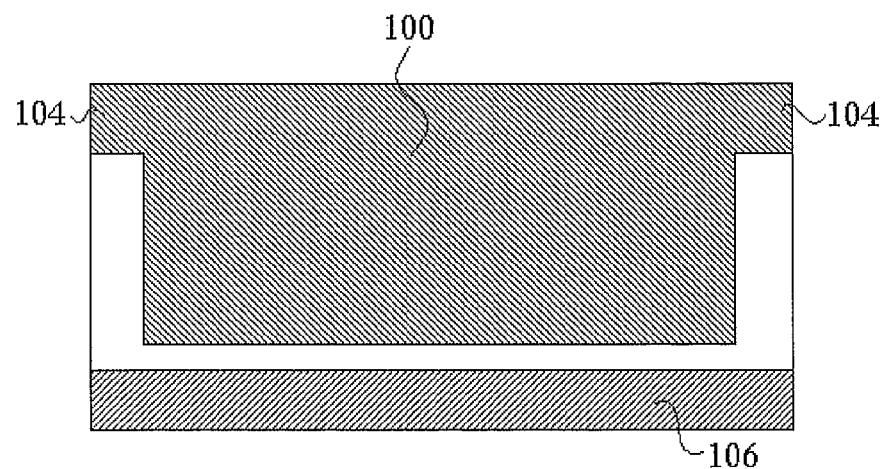
FIGS. 6A and 6B respectively illustrate generally top views of an exemplary electrode layer configuration in accordance with the present subject matter for use in multilayer capacitor embodiments.
Figure 6B:
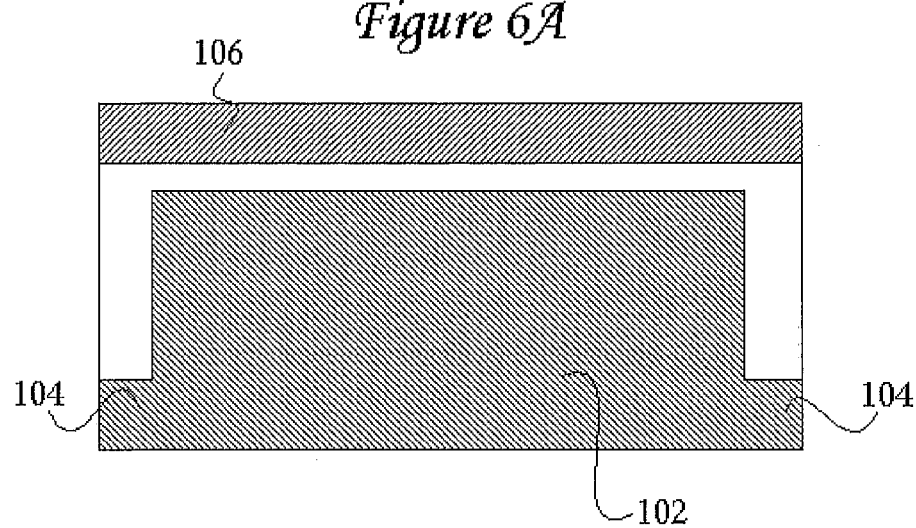
Figure 6C:
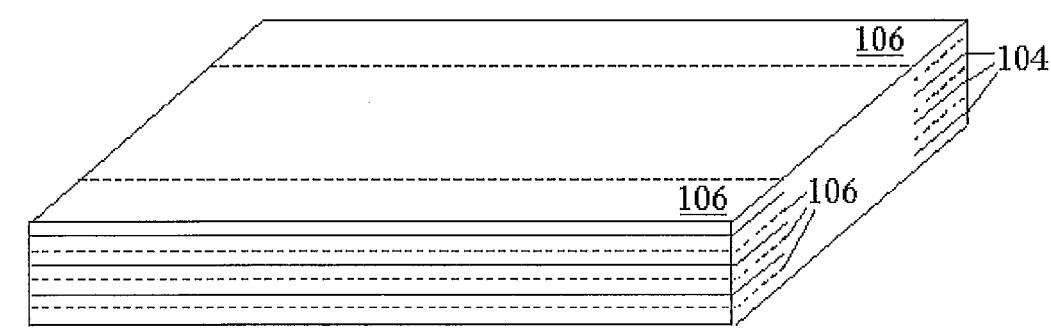
FIG. 6C illustrates a generally side perspective view of an exemplary multilayer capacitor embodiment in accordance with the present subject matter with electrode layer configurations such as those illustrated in FIGS. 6A and 6B.

Still further exemplary embodiments of the present subject matter relate to the multilayer capacitor configurations illustrated in FIGS. 6A through 6C, respectively, which are improvements to the exemplary multilayer capacitor configurations of FIGS. 5A through 5C, respectively.

Figure 7A:
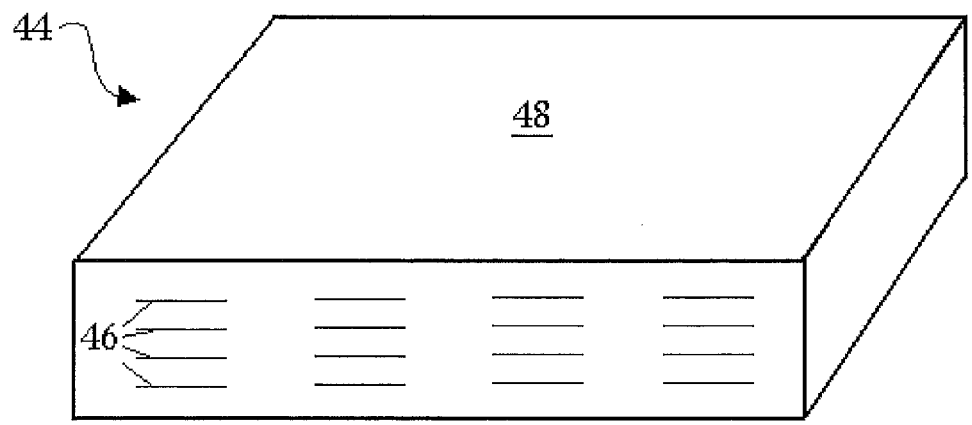
FIG. 7A illustrates a generally side perspective view of an exemplary capacitor array with exposed electrode tabs.
Figure 7B:
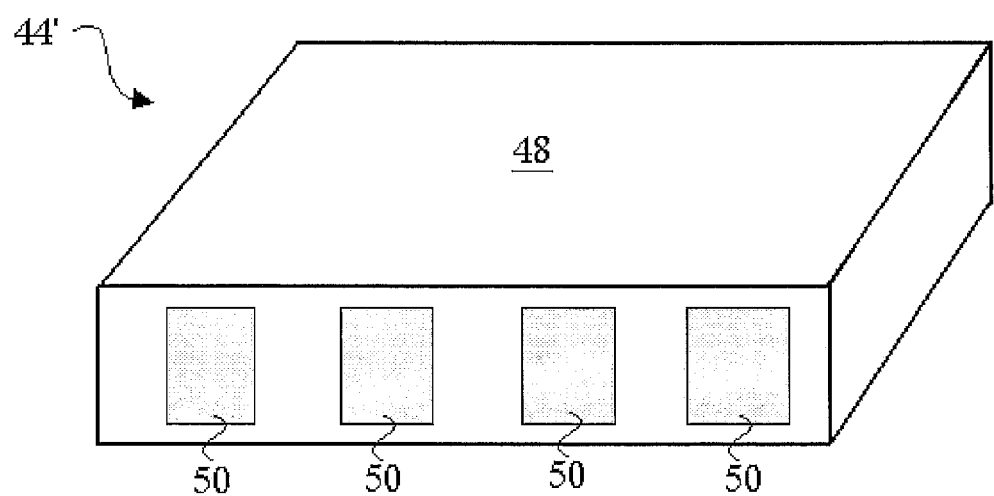
FIG. 7B illustrates a generally side perspective view of an exemplary capacitor array with plated terminations in accordance with the present subject matter.
Figure 8A:
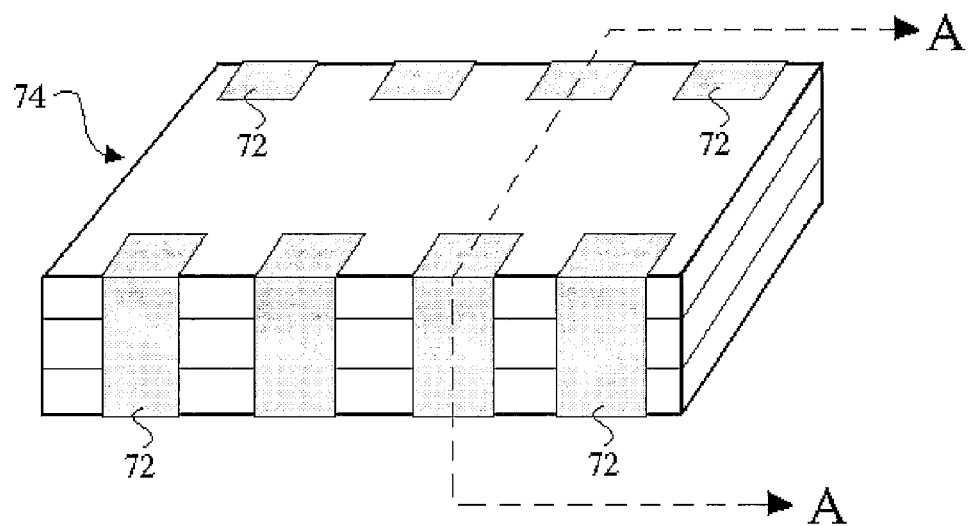
FIG. 8A illustrates a generally side perspective view of an exemplary multilayer interdigitated capacitor with plated terminations in accordance with the present subject matter.
Figure 8B:
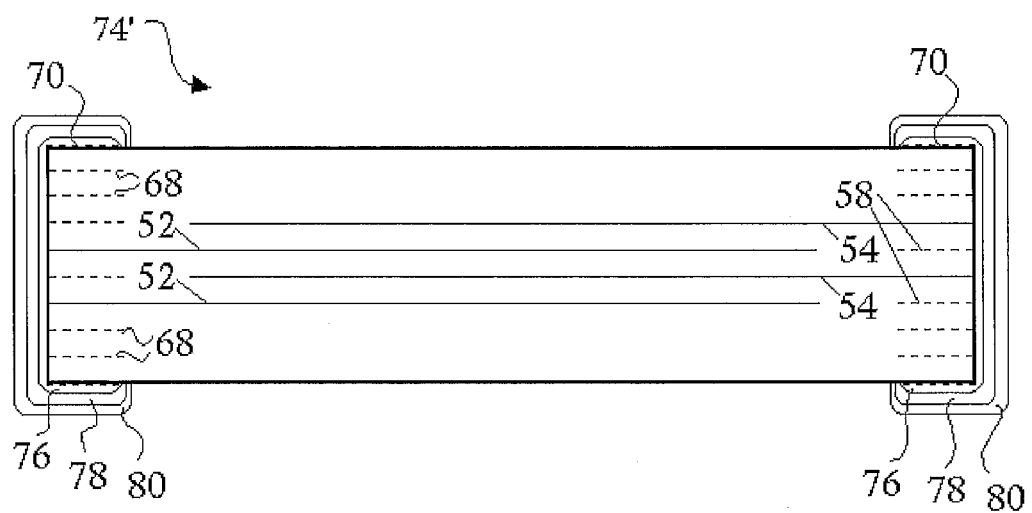
FIG. 8B illustrates a side cross-sectional view of an exemplary multilayer interdigitated capacitor with exemplary plated terminations in accordance with the disclosed technology taken along planar section line A-A of FIG. 8A.

Additional embodiments of the disclosed technology are presented with reference to the exemplary capacitor arrays of FIGS. 7A and 7B. FIGS. 8A and 8B then represent aspects of the subject plated termination features, while FIGS. 9A and 9B concern an exemplary integrated passive component with selective terminations in accordance with the present subject matter.

It should be noted that each of the exemplary embodiments as presented herein should not insinuate limitations of the disclosed technology. Features illustrated or described as part of one embodiment can be used in combination with another embodiment to yield further embodiments. Additionally, certain features may be interchanged with similar devices or features not mentioned yet which perform the same, similar or equivalent function.

Reference will now be made in detail to the presently preferred embodiments of the disclosed technology. Referring to the drawings, FIG. 1A illustrates a known exemplary configuration of electrode layers 10 and 12 with electrode tabs 14 for use in a multilayer interdigitated capacitor or capacitor array. Electrode layers are arranged in parallel with tabs 14 extending from the layers such that electrode tabs extending from alternating electrode layers 10 and 12 are aligned in respective columns. The exemplary illustration depicts four such electrode layers with corresponding tabs 14, but typical arrangements as utilized with the present technology may in some instances contain many more electrode layers and respective tabs. This feature provides the option of creating capacitive elements with a large range of capacitance values (by choosing the number of electrodes).

The exemplary electrode layer configuration of FIG. 1A is not representative of a finished capacitor embodiment. Instead, FIG. 1A provides a reference for an intermediate aspect of exemplary capacitor and capacitor array configurations. The electrode layer configuration of FIG. 1A can be utilized in accordance with an exemplary multilayer interdigitated capacitor such as displayed in FIG. 1B.

An interdigitated capacitor typically consists of a plurality of electrode layers, such as those shown in FIG. 1A disposed in a body of dielectric material 18, such as seen in the exemplary interdigitated capacitor configuration 16 of FIG. 1B. Electrode layers 10 and 12 are disposed in the dielectric material 18 such that electrode tabs 14 extend to and are exposed at two sides of IDC embodiment 16. Exemplary materials for such electrode layers may include platinum, nickel, a palladium-silver alloy, or other suitable conductive substances. Dielectric material 18 may comprise barium titanate, zinc oxide, alumina with low-fire glass, or other suitable ceramic or glass-bonded materials. Alternatively, the dielectric may be an organic compound such as an epoxy (with or without ceramic mixed in, with or without fiberglass), popular as circuit board materials, or other plastics common as dielectrics. In these cases the conductor is usually a copper foil which is chemically etched to provide the patterns.

Exemplary IDC embodiment 16 may alternatively be viewed as a multilayer configuration of alternating electrode layers and dielectric layers in portion 20 of the device. IDC 16 is typically further characterized by a topmost dielectric layer 22 and bottommost dielectric layer 24 that may generally be thicker than other dielectric layers of IDC configuration 16. Such dielectric layers 22 and 24 act as cover layers to protect the device and provide sufficient bulk to withstand the stress of glass/metal frit that may be fired to a capacitor body. Known capacitor embodiments have utilized the multilayer arrangement of FIG. 1B, and the present subject matter utilizes aspects of such configuration 16 in accordance with additional features disclosed herein.

A multilayer IDC component 16 such as that of FIG. 1B that incorporates the known exemplary electrode layer configuration of FIG. 1A is characterized by electrode portions 14 that are exposed on two selected sides of IDC component 16. Other exemplary internal electrode configurations may be employed in a multilayer component such that internal electrode portions are exposed at different locations and/or on different numbers of sides of the device.

For example, consider the exemplary internal electrode layer configuration illustrated in the exploded view of FIG. 3A. Alternating electrode layers 26 and 28 are provided with electrode tab portions 30 extending toward a single selected direction. Electrode tabs 30 for each set of alternating electrode layers are preferably arranged in a stacked configuration such that, for instance, tabs 30 from electrode layers 26 are aligned in two respective columns. A similar alignment situation preferably holds for tabs 30 of electrode layers 28. A multilayer capacitor or other passive component that utilizes the exemplary internal electrode configuration of FIG. 3A will typically be configured such that electrode tab portions 30 are exposed on a single selected side of the component.

Yet another exemplary internal electrode layer configuration provides for electrode tabs that are exposed on four sides of a multilayer interdigitated component. Such internal electrode layers may be similar to the configuration depicted in FIG. 1A wherein each alternating electrode layer 10 and 12 has additional tab portions on the sides of the layers adjacent to the sides from which tab portions 14 extend.

A still further exemplary electrode layer configuration and corresponding multilayer capacitor embodiment is depicted in FIGS. 5A through 5C, respectively. A first plurality of internal electrode layers 32 such as in FIG. 5A are interleaved with internal electrode layers 34, such as in FIG. 5B, in a body of dielectric material 36 to form a multilayer capacitor 38 such as in FIG. 5C. In such exemplary multilayer component 38, portions 40 of one set of electrode layers 32 or 34 is exposed on side 42 of component 38. The portions of the other set of electrode layers 32 or 34 is thus exposed on the side of the device opposite of side 42 (not seen in the drawing).

Referring again to FIG. 1B, a typical conventional termination for IDC embodiment 16 and for other monolithic electronic components comprises a printed and fired thick-film stripe of silver, copper, or other suitable metal in a glass matrix, on top of which is plated a layer of nickel to promote leach resistance, and is followed by a layer of tin or solder alloy which protects the nickel from oxidation, and promotes an easily soldered termination.

A thick-film stripe in accordance with such type of termination also typically requires printed application by a termination machine and printing wheel or other suitable component to transfer a metal-loaded paste. Such printing hardware may have resolution limits that make it hard to apply thick-film stripes, especially to smaller chips. A typical existing size for an IDC 16 or other electronic component is about one hundred and twenty mils (thousandths of an inch) by sixty mils along the two opposing sets of sides with a thickness from top to bottom layers of about thirty mils. When more than four terminations need to be applied to a part this size or terminations are desired for a part with smaller dimensions, the resolution levels of specialized termination machinery often becomes a limitation in applying effective termination stripes.

The present subject matter offers a termination scheme that eliminates or greatly simplifies the provision of such typical thick-film termination stripes. By eliminating the less-controlled thick film stripe, the need for typical termination printing hardware is obviated. Termination features in accordance with the disclosed technology focus more on the plated layer of nickel, tin, copper, etc. that is typically formed over a thick-film termination stripe.

Consider the exemplary capacitor array configuration 44 presented in FIG. 7A. Capacitor array 44 is characterized by a plurality of internal electrodes and corresponding electrode tabs 46 embedded in a body of dielectric material 48. As opposed to the electrode layers of exemplary IDC configuration 16, the electrode tabs 46 of capacitor array 44 typically correspond to separate internal electrodes. By subjecting capacitor array 44 or other electronic component with similarly exposed electrode tabs to an electroless plating solution, for example nickel or copper ionic solution, the formation of plated terminations 50, such as is shown in FIG. 7B, is preferably effected. Exposure to such solution enables the exposed electrode tabs 46 to become deposited with nickel, copper, tin or other metallic plating. The resulting deposition of plated material is preferably enough to effect an electrical connection between adjacent electrode tabs 46 in a stacked column. The distance between adjacent electrode tabs in a column of tabs should preferably be no greater than about ten microns to ensure proper plating. The distance between adjacent columnar stacks of electrode tabs 46 should thus be greater by at least a factor of 2 than this minimum distance to ensure that distinct terminations 50 do not run together. In some embodiments of the present technology, the distance between adjacent columnar stacks of exposed metallization is about four times the distance between adjacent exposed electrode tabs 46 in a particular stack. By controlling the distance between exposed internal conductor portions, termination connectivity can be manipulated to form bridged or non-bridged terminations depending on the desired termination configuration.

Plated terminations 50 are thus guided by the positioning of the exposed electrode tabs 46. This phenomena is hereafter referred to as "self-determining" since the formation of plated terminations 50 is determined by the configuration of exposed metallization at selected peripheral locations on multilayer component, or capacitor array, 44. The exposed internal electrode tabs 46 also help anchor terminations 50 to the periphery of capacitor array 44', which corresponds to a multilayer capacitor embodiment such as 44 of FIG. 7A with the addition of plated terminations 50. Further assurance of complete plating coverage and bonding of the metals may be achieved by including resistance-reducing additives in the plating solution. A still further mechanism for enhancing the adhesion of metallic deposit that forms the subject plated terminations is to thereafter heat the component in accordance with such technologies as baking, laser subjection, UV exposure, microwave exposure, arcwelding, etc.

The plated terminations 50 of FIG. 7B may be sufficiently formed for some component applications, but sometimes the exposed metallization from internal electrode tabs is insufficient to form the self-determining terminations of the present technology. In such case, it may be beneficial, and in some cases necessary, to provide additional anchor tabs embedded within select portions of a monolithic component. Anchor tabs are short conductive tabs that typically offer no electrical functionality to a component, but mechanically nucleate and secure additional plated termination along the periphery of a monolithic device. Exposed anchor tabs in combination with exposed internal electrode portions can provide sufficient exposed metallization to create more effective self-determining terminations.

Figure 2A:
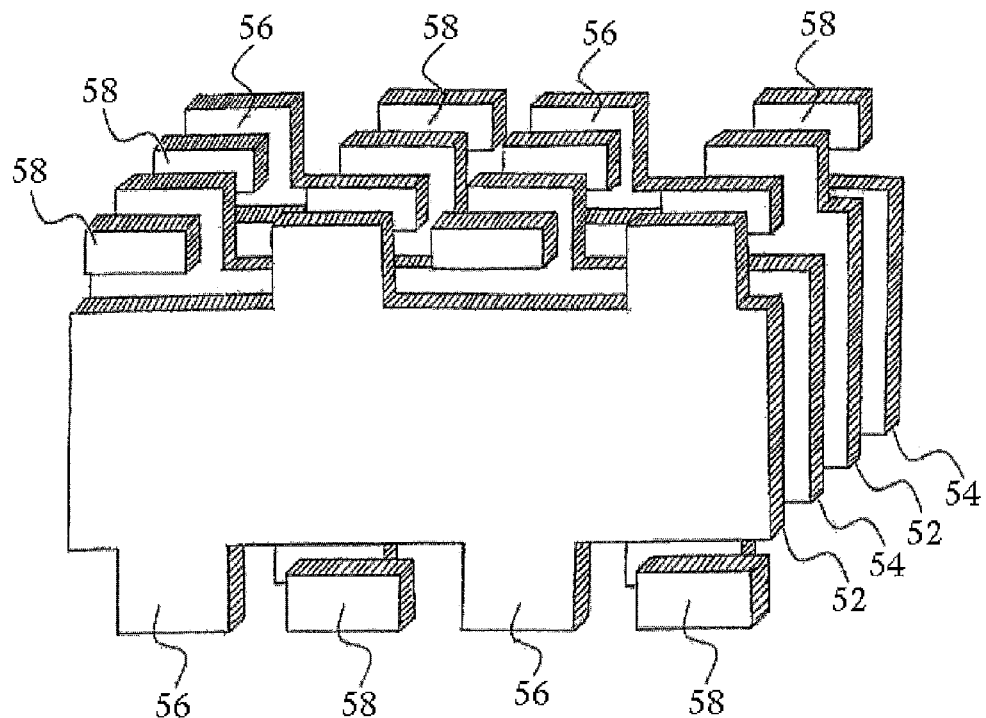
FIG. 2A illustrates a generally top exploded view of an exemplary internal electrode layer and anchor tab configuration for a multilayer interdigitated capacitor in accordance with the present subject matter.

For instance, consider the exploded configuration of exemplary internal metallization illustrated in FIG. 2A.

Alternating electrode layers 52 and 54 are provided in a similar configuration to the electrode layers of FIG. 1A, with electrode tab portions 56 extending from selected locations of electrode layers 52 and 54. Additional anchor tabs 58 are also preferably provided in the same plane as active electrode layers 52 and 54 such that they are also exposed at selected locations along a multilayer component, yet offer no internal electrical connections. Additional anchor tabs may also be provided in the cover layers of a multilayer component and exposed along selected sides such that the formation of self-determining plated terminations that extend along even more of the component periphery is enabled.

Figure 2B:
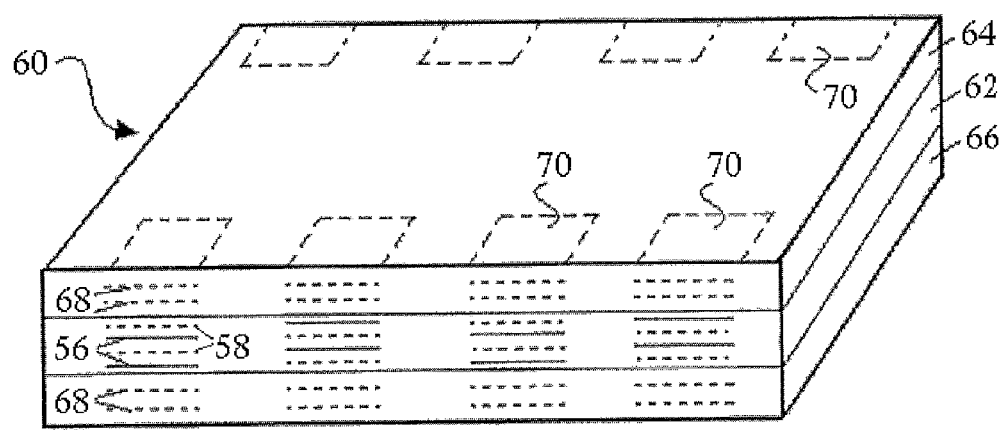
FIG. 2B illustrates a generally side perspective view of an exemplary multilayer interdigitated capacitor in accordance with the present subject matter with internal electrode and anchor tab portions such as illustrated in FIG. 2A.

With reference to FIG. 2B, multilayer component 60 corresponds to an exemplary multilayer capacitor embodiment in accordance with the present subject matter. Portion 62 of multilayer component 60 preferably comprises the exemplary interdigitated electrode layer and anchor tab configuration of FIG. 2A embedded within a portion of dielectric material. Solid lines 56 along the periphery of portion 62 are intended to represent exposed portions of the electrode tabs 56 of FIG. 2A, and dashed lines 58 along the periphery of portion 62 represent exposed anchor tabs 58. Additional anchor tabs may be embedded within dielectric cover layers 64 and 66 (exposed portions of which are represented by dashed lines 68) to further provide an arrangement of exposed metallization for facilitating the formation of self-determining plated terminations in accordance with the present subject matter.

Internal anchor tabs are preferably aligned in a generally similar column as a stack of internal electrode tabs such that all internal tabs are arranged in common stacks.

For some component applications, it may be preferred that terminations not only extend along the entire width of a component, but also wrap around to the top and bottom layers. In this case, external anchor tabs 70 may be positioned on top and bottom layers of multilayer IDC 60 such that plated terminations can form along the sides and on portions of the top and bottom layers, forming extended solder lands. For example, the provision of embedded internal anchor tabs 58 and 68 and external anchor tabs 70 along with existing exposed electrode tabs 56 in IDC 60, such as depicted in FIG. 2B, would facilitate the formation of wrap-around plated terminations 72, such as in FIG. 8A.

There are several different techniques that can potentially be used to form plated terminations, such as terminations 72 on multilayer component embodiment 74 of FIG. 8A. As previously addressed, a first method corresponds to electroplating or electrochemical deposition, wherein an electronic component with exposed conductive portions is exposed to a plating solution such as electrolytic nickel or electrolytic tin characterized by an electrical bias. The component itself is then biased to a polarity opposite that of the plating solution, and conductive elements in the plating solution are attracted to the exposed metallization of the component. Such a plating technique with no polar biasing is referred to as electroless plating, and can be employed in conjunction with electroless plating solutions such as nickel or copper ionic solution.

In accordance with electrochemical deposition and electroless plating techniques, a component such as IDC 74 of FIG. 8A, is preferably submersed in an appropriate plating solution for a particular amount of time. With certain embodiments of the present subject matter, no longer than fifteen minutes is required for enough plating material to deposit at exposed conductive locations along a component such that buildup is enough to spread the plating material in a perpendicular direction to the exposed conductive locations and create a connection among selected adjacent exposed conductive portions.

Another technique that may be utilized in accordance with the formation of the subject plated terminations involves magnetic attraction of plating material. For instance, nickel particles suspended in a bath solution can be attracted to similarly conductive exposed electrode tabs and anchor tabs of a multilayer component by taking advantage of the magnetic properties of nickel. Other materials with similar magnetic properties may be employed in the formation of plated terminations.

A still further technique regarding the application of plated termination material to exposed electrode tabs and anchor tabs of a multilayer component involves the principles of electrophoretics or electrostatics. In accordance with such exemplary technology, a bath solution contains electrostatically charged particles. An IDC or other multilayer component with exposed conductive portions may then be biased with an opposite charge and subjected to the bath solution such that the charged particles are deposited at select locations on the component. This technique is particularly useful in the application of glass and other semiconductive or nonconductive materials. Once such materials are deposited, it is possible to thereafter convert the deposited materials to conductive materials by intermediate application of sufficient heat to the component.

One particular methodology for forming plated terminations in accordance with the disclosed technology relates to a combination of the above-referenced plating application techniques. A multilayer component may first be submersed in an electroless plating solution, such as copper ionic solution, to deposit an initial layer of copper over exposed tab portions, and provide a larger contact area. The plating technique may then be switched to an electrochemical plating system which allows for a faster buildup of copper on the selected portions of such component.

In accordance with the different available techniques for plating material to exposed metallization of a multilayer component in accordance with the present technology, different types of materials may be used to create the plated terminations and form electrical connections to internal features of an electrical component. For instance, metallic conductors such as nickel, copper, tin, etc. may be utilized as well as suitable resistive conductors or semi-conductive materials, and/or combinations of selected of these different types of materials. A particular example of plated terminations in accordance with the present subject matter wherein plated terminations comprise a plurality of different materials is discussed with reference to FIG. 8B. FIG. 8B provides a cross-sectional view of component 74 of FIG. 8A taken along planar section line A-A in accordance with a particular exemplary embodiment of plated terminations 72. It should be appreciated that terminations 72 may comprise only a first plating layer and no additional layers as presented in this example. Due to such potential for variation in the number of plating layers in the multilayer component and termination embodiments of FIGS. 8A and 8B, the two respective embodiments are labeled as 74 and 74' respectively, and such reference is not intended to insinuate additional variations between the two respective embodiments.

A first step in the formation of the terminations illustrated in FIG. 8B involves submersing a component in an electroless copper plating solution such that a layer of copper 76 or other metal is deposited along the periphery of component 74' where portions of internal anchor tabs 58 and 68, exposed internal electrode tabs extending from electrode layers 52 and 54, and external anchor tabs 70 are exposed. The tab area covered with metallic plating 76 can then be covered with a resistor-polymeric material 78 and then plated again with metallic copper or other material 80.

A still further plating alternative corresponds to forming a layer of metallic plating, and then electroplating a resistive alloy over such metallic plating. Plating layers can be provided alone or in combination to provide a variety of different plated termination configurations. A fundamental of such plated terminations is that the self-determining plating is configured by the design and positioning of exposed conductive portions along the periphery of a component.

Such particular orientation of internal electrode portions and anchor tabs may be provided in a variety of different configurations to facilitate the formation of plated terminations in accordance with the present subject matter. For instance, consider the exemplary internal conductive configuration of FIG. 3B with electrode layers 26 and 28. Electrode tabs 30 and internal anchor tabs 82 may be provided in a body of dielectric material to create a multilayer component similar to that of FIG. 4A. Additional internal anchor tabs 84 and external anchor tabs 86 may also be provided. One of the prescribed plating techniques may then be utilized to form plated terminations on multilayer component 88 along the exposed areas of metallization.

Yet another exemplary multilayer component in accordance with aspects of the present subject matter is represented as component 90 in FIG. 4B. Internal electrode layers are provided with electrode tabs that extend to four sides of component 90. Additional internal anchor tabs 94 may be interleaved with exposed electrode tabs 92. Still further internal anchor tabs 96 may be embedded within cover layers of component 90 to provide for expanded plated terminations. The provision of external anchor tabs 98 could facilitate the formation of wrap-around plated terminations.

A still further application of the presently disclosed technology relates to more general multilayer component configurations, such as depicted in FIGS. 6A, 6B and 6C.

Electrode layer 100 of FIG. 6A and electrode layer 102 of FIG. 6B are provided in respective T-shaped configurations such that electrode tab portions 104 extend from the respective electrode layers. When electrode layers 100 and 102 are interleaved with dielectric layers to form a multilayer ceramic device, such as shown in FIG. 6C, each electrode tab portion 104 is exposed on two adjacent sides of the device 108. Anchor tab portions 106 may also be provided within the electrode layer planes such that exposed conductive portions are aligned along the opposing peripheral sides of device 108, to facilitate formation of plated electrodes thereon.

Figure 9A:
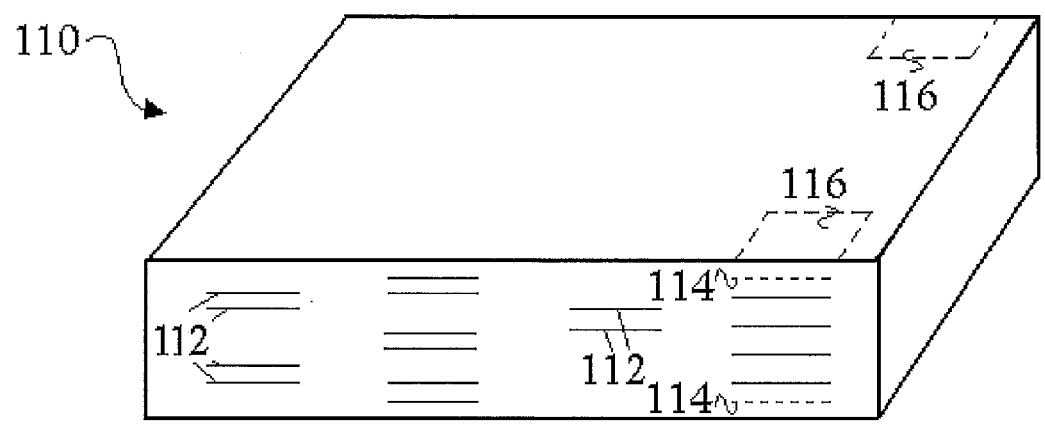
FIG. 9A illustrates a generally side view, with slight top perspective, of an exemplary monolithic integrated passive component with exposed electrode tabs and additional anchor tabs in accordance with the disclosed technology.
Figure 9B:
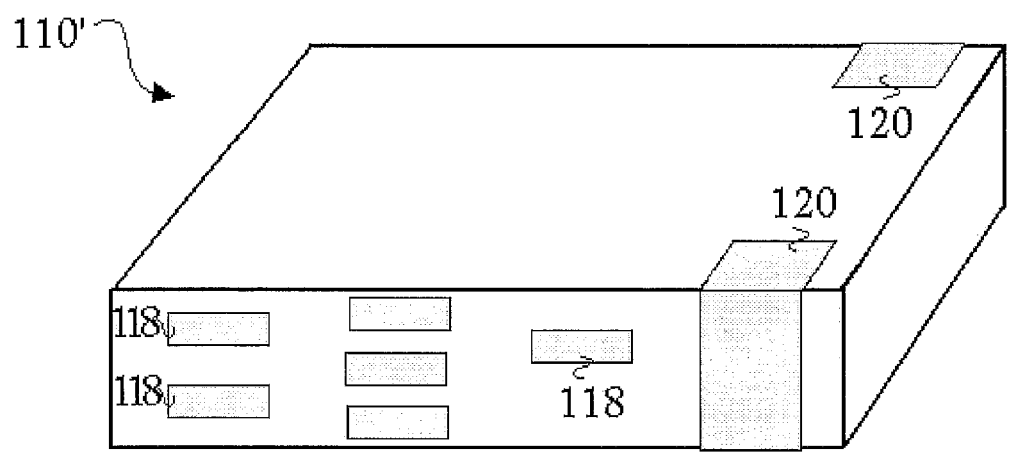
FIG. 9B illustrates a generally side view, with slight top perspective, of an exemplary monolithic integrated passive component with plated terminations in accordance with the present subject matter.

Another example embodying aspects of the disclosed technology is presented with respect to FIGS. 9A and 9B. FIG. 9A represents an integrated passive component 110, comprising a combination of passive components provided in a single monolithic structure. Integrated component 110 may include a selected combination of resistors, varistors, capacitors, inductors, couplers, baluns, and/or other passive components. Each distinct passive component is typically characterized by at least one conductive electrode-like portion from which at least one electrode tab portion 112 extends and is exposed along the periphery of component 110.

An integrated passive component 110, such as that represented by FIG. 9A, may have a plurality of different internal electrode arrangements as shown. Corresponding electrode tabs 112 may be provided in symmetrical or nonsymmetrical configurations and may be grouped in a variety of fashions. An important feature is that exposed electrode tabs 112 may be arranged within component 110 to facilitate the formation of selective plated terminations. In addition, internal anchor tabs 114 and/or external anchor tabs 116 may also be provided with an integrated passive component to create additional selective termination arrangements. For example, consider the exposed tab arrangement of FIG. 9A, with numerous exposed internal electrode tabs 112, internal anchor tabs 114, and external anchor tabs 116. Subjecting such configuration to a plating solution in accordance with variations of the presently disclosed technology would preferably effect the formation of a plurality of plated side terminations 118 and plated wrap-around terminations 120, such as in FIG. 9B. Integrated passive component, or multilayer electronics device, 110' simply corresponds to an integrated passive component such as 110 of FIG. 9A with the addition of plated terminations 118 and 120, respectively. Thus, tabs of an integrated passive component can be designed whereby plated terminations can be formed among different electrodes and different component layers.

It should be appreciated that the monolithic component embodiments presented in FIGS. 1A through 9B, respectively, are presented merely as examples of the disclosed technology, including intermediate aspects thereof. In most of the examples, four or more general columns of electrodes are depicted, but a fewer or greater number of electrode columns are possible, depending on the desired component configuration. It is possible to form plated terminations along any selected portion of any selected component side in accordance with the disclosed technology. Such plated terminations may include a single layer of plated conductive material, resistive material, or semi-conductive material, or a multilayer combination of selected of such materials.

It should be appreciated that internal anchor tabs and external anchor tabs may selectively be used for different termination preferences to provide different sizes of side terminations or wrap-around terminations. IDC embodiments displayed and described herein that feature both internal and external anchor tabs may, for instance, only utilize internal anchor tab features when wrap-around terminations are not preferred for a particular application. Different combinations of both internal and external anchor tabs with existing exposed electrode tabs on a variety of different multilayer components can yield numerous potential termination schemes for a device.

While the present subject matter has been described in detail with respect to specific embodiments thereof, it will be appreciated that those skilled in the art, upon attaining an understanding of the foregoing may readily adapt the present technology for alterations to, variations of, and equivalents to such embodiments. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art.

What is claimed:

1. A method of making a multi-layer electronic component, comprising the steps of:
    providing a plurality of dielectric layers, each dielectric layer being delimited laterally by edges;
    interleaving a plurality of internal electrode elements among selected of said plurality of dielectric layers, such that selected portions of said plurality of internal electrode elements extend to and are exposed along at least one edge of said plurality of dielectric layers, said interleaved combination of electrode elements and dielectric layers forming a monolithic assembly characterized by respective opposing major surfaces thereof;
    providing a plurality of internal anchor tabs interleaved among selected of said plurality of dielectric layers and exposed along selected edges of said plurality of dielectric layers;
    configuring said plurality of internal electrode elements in a generally interdigitated configuration with multiple electrode tab portions extending from one or more selected sides of selected internal electrode elements such that the electrode tab portions are exposed at a predetermined number of multiple aligned columns at peripheral locations within a predetermined distance from each other of no more than about ten microns on the multi-layer electronic component;
    applying at least a pair of plated terminations over selected of said multiple aligned columns, respectively, of exposed electrode tab portions so that a predetermined distance is formed between such plated terminations; and
    wherein said monolithic assembly satisfies the structural relationship of T=about (¼) W, where a dimension of the assembly measured in a direction interconnecting lateral surfaces is W and a dimension thereof measured in a direction interconnecting opposing major surfaces thereof is T.

2. A method of making a multi-layer electronic component as in claim 1, wherein said at least a pair of plated terminations are applied so as to extend over respective end surfaces of said assembly.

3. A method of making a multi-layer electronic component as in claim 1, wherein said at least a pair of plated terminations respectively each form a substantially rectangular region on a respective surface of said assembly.

4. A method of making a multi-layer electronic component, comprising the steps of:
    providing a plurality of dielectric layers, each dielectric layer being delimited laterally by edges;
    interleaving a plurality of internal electrode elements among selected of said plurality of dielectric layers, such that selected portions of said plurality of internal electrode elements extend to and are exposed along at least one edge of said plurality of dielectric layers, said interleaved combination of electrode elements and dielectric layers forming a monolithic assembly characterized by respective opposing major surfaces thereof;

providing a plurality of internal anchor tabs interleaved among selected of said plurality of dielectric layers and exposed along selected edges of said plurality of dielectric layers;

configuring said plurality of internal electrode elements in a generally interdigitated configuration with multiple electrode tab portions extending from one or more selected sides of selected internal electrode elements such that the electrode tab portions are exposed at a predetermined number of multiple aligned columns at peripheral locations within a predetermined distance from each other of no more than about ten microns for adjacent tab portions in a given aligned column thereof on the multi-layer electronic component;

applying at least a pair of plated terminations over selected of said multiple aligned columns, respectively, of exposed electrode tab portions so that a predetermined distance is formed between such plated terminations; and wherein said monolithic assembly satisfies the structural relationship of T≤about (½) W, where a dimension of the assembly measured in a direction interconnecting lateral surfaces is W and a dimension thereof measured in a direction interconnecting opposing major surfaces thereof is T.

5. A method of making a multi-layer electronic component as in claim 4, wherein said monolithic assembly satisfies the structural relationship of T=about (¼) W to about (½) W, where a dimension of the assembly measured in a direction interconnecting lateral surfaces is W and a dimension thereof measured in a direction interconnecting opposing major surfaces thereof is T.

6. A method of making a multi-layer electronic component as in claim 4, wherein the distance between adjacent of said aligned columns of said exposed electrode tab portions is at least about twice as great as the distance between adjacent tab portions in a given aligned column thereof.

7. A method of making a multi-layer electronic component as in claim 6, wherein the distance between adjacent of said aligned columns of said exposed electrode tab portions is at least about four times as great as the distance between adjacent tab portions in a given aligned column thereof.

8. A method of making a multi-layer electronic component as in claim 4, wherein said at least a pair of plated terminations are applied so as to extend over respective end surfaces of said assembly.

9. A method of making a multi-layer electronic component as in claim 4, wherein said at least a pair of plated terminations respectively each form a substantially rectangular region on a respective surface of said assembly.

10. A method of making a multi-layer electronic component, comprising the steps of:
providing a plurality of dielectric layers, each dielectric layer being delimited laterally by edges;
interleaving a plurality of internal electrode elements among selected of said plurality of dielectric layers, such that selected portions of said plurality of internal electrode elements extend to and are exposed along at least one edge of said plurality of dielectric layers, said interleaved combination of electrode elements and dielectric layers forming a monolithic assembly characterized by respective opposing major surfaces thereof;

providing a plurality of internal anchor tabs interleaved among selected of said plurality of dielectric layers and exposed along selected edges of said plurality of dielectric layers;

configuring said plurality of internal electrode elements in a generally interdigitated configuration with multiple electrode tab portions extending from one or more selected sides of selected internal electrode elements such that the electrode tab portions are exposed at a predetermined number of multiple aligned columns at peripheral locations within a predetermined distance from each other of no more than about ten microns for adjacent tab portions in a given aligned column thereof on the multi-layer electronic component;

applying at least a pair of plated terminations over selected of said multiple aligned columns, respectively, of exposed electrode tab portions so that a predetermined distance is formed between such plated terminations; and wherein the distance between adjacent of said aligned columns of said exposed electrode tab portions is at least about twice as great as the distance between adjacent tab portions in a given aligned column thereof.

11. A method of making a multi-layer electronic component as in claim 10, wherein the distance between adjacent of said aligned columns of said exposed electrode tab portions is at least about four times as great as the distance between adjacent tab portions in a given aligned column thereof.

12. A method of making a multi-layer electronic component as in claim 10, wherein said monolithic assembly satisfies the structural relationship of T≤about (½) W, where a dimension of the assembly measured in a direction interconnecting lateral surfaces is W and a dimension thereof measured in a direction interconnecting opposing major surfaces thereof is T.

13. A method of making a multi-layer electronic component as in claim 12, wherein said monolithic assembly satisfies the structural relationship of T=about (¼) W to about (½) W, where a dimension of the assembly measured in a direction interconnecting lateral surfaces is W and a dimension thereof measured in a direction interconnecting opposing major surfaces thereof is T.

14. A method of making a multi-layer electronic component as in claim 10, wherein said at least a pair of plated terminations are applied so as to extend over respective end surfaces of said assembly.

15. A method of making a multi-layer electronic component as in claim 10, wherein said at least a pair of plated terminations respectively each form a substantially rectangular region on a respective surface of said assembly.

* * * * *